United States Patent [19]
Sridhar

[11] Patent Number: 5,488,613
[45] Date of Patent: Jan. 30, 1996

[54] SCAN TEST CIRCUITS FOR USE WITH MULTIPLE FREQUENCY CIRCUITS

[75] Inventor: Thirumalai Sridhar, Hudson, N.H.

[73] Assignee: Texas Instruments Incorporated, Dallas, Tex.

[21] Appl. No.: 988,383

[22] Filed: Dec. 8, 1992

Related U.S. Application Data

[63] Continuation of Ser. No. 511,677, Apr. 20, 1990, abandoned.

[51] Int. Cl.$^6$ ................................................ G01R 31/28
[52] U.S. Cl. ................................... 371/22.3; 371/61
[58] Field of Search ................................ 371/22.3, 22.1, 371/61

[56] References Cited

U.S. PATENT DOCUMENTS

| | | | |
|---|---|---|---|
| 4,021,784 | 5/1977 | Kimlinger | 364/200 |
| 4,493,077 | 1/1985 | Agrawal et al. | 371/22.3 |
| 4,534,028 | 8/1985 | Trischler | 371/22.3 |
| 4,542,509 | 9/1985 | Buchanan et al. | 371/22.3 X |
| 4,597,080 | 6/1986 | Thatte et al. | |
| 4,698,588 | 10/1987 | Hwang et al. | |
| 4,701,921 | 10/1987 | Powell et al. | |
| 4,710,931 | 12/1987 | Bellay et al. | |
| 4,862,068 | 8/1989 | Kawashima et al. | 371/22.3 X |
| 4,870,346 | 9/1989 | Mydill et al. | |
| 5,008,618 | 4/1991 | Van Der Star | 371/22.3 X |

FOREIGN PATENT DOCUMENTS

| 10108255 | 5/1984 | European Pat. Off. . |
|---|---|---|
| 10108256 | 5/1984 | European Pat. Off. . |

*Primary Examiner*—Robert W. Beausoliel, Jr.
*Assistant Examiner*—Glenn Snyder
*Attorney, Agent, or Firm*—Brian C. McCormack; James C. Kesterson; Richard L. Donaldson

[57] ABSTRACT

A scan path test architecture for testing circuits using multiple system clocks with different frequencies includes a controller (16) for disabling the system clocks during a test cycle and a master clock for generating a signal frequency signal to each circuit module (10a–c), eliminating the need for partitioning scan paths between modules and synchronizing system clocks.

19 Claims, 1 Drawing Sheet

SCAN TEST CIRCUITS FOR USE WITH MULTIPLE FREQUENCY CIRCUITS

RELATED APPLICATIONS

This application is a continuation of application Ser. No. 07/511,677 filed Apr. 20, 1990, now abandoned.

TECHNICAL FIELD OF THE INVENTION

This invention relates in general to electronic circuits, and more particularly to scan path testing of electronic circuits.

BACKGROUND OF THE INVENTION

Advanced circuit design techniques have resulted in increasingly complex circuits, both at the integrated circuit and printed circuit board level of electronic design. Diminished physical access is unfortunate consequence of denser designs and shrinking interconnect pitch. Testability is needed so that the finished product is both controllable and observable during test and debug. Any manufacturing defect is preferably detectable during final test before product is shipped. This basic necessity is difficult to achieve for complex designs without taking testability into account and the logic design phase so that automatic test equipment can test the product. A popular test architecture is the scan path architecture disclosed in U.S. patent application Ser. Nos. 07/391,751 (Attorney Docket No. TI-14158) and 07/391,801 (Attorney Docket No. TI-14421), to Whetsel, both filed Aug. 9, 1989, and the entire issue of the Texas Instruments Technical Journal, Vol. 5, No. 4, all of which are incorporated by reference herein.

However, if the original design for the circuit for which testing is desired has more than one clock, then the testing procedure is much more complex. The clocks will either be asynchronous or synchronous with different frequencies. In such cases, a single "run" cycle (or "test execute" cycle) needs to be correctly synchronized between portions of the logic controlled by different clock frequencies.

One solution would be to partition circuit modules controlled by different clock frequencies and treat each module as an independent design. The scan paths would be implemented in each module separately with independent scan paths. Using this method, only one module could be tested at a time and the test time would be dominated by the modules clocked by the slowest clock or with the longest scan path. Thus, this method entails more test logic and more test time.

Therefore, a need has arisen for a scan path test architecture which allows efficient testing of circuits using multiple clock frequencies.

SUMMARY OF THE INVENTION

In accordance with the present invention, a scan path test method and circuitry therefore is provided which substantially eliminates the disadvantages and problems associated with prior scan path techniques.

In the present invention, a plurality of circuit modules are controlled by two or more system clocks of differing frequencies. During the test mode, the system clocks are disabled such that the circuit modules are controlled by a master clock. Test data is scanned through the modules using the master clock and a run cycle is performed on the modules. Additional test data is scanned through the modules using the master clock.

The present invention provides the technical advantage that the problems inherent in partitioning and synchronizing different clocks during a single run cycle is eliminated.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figures 1, 2:
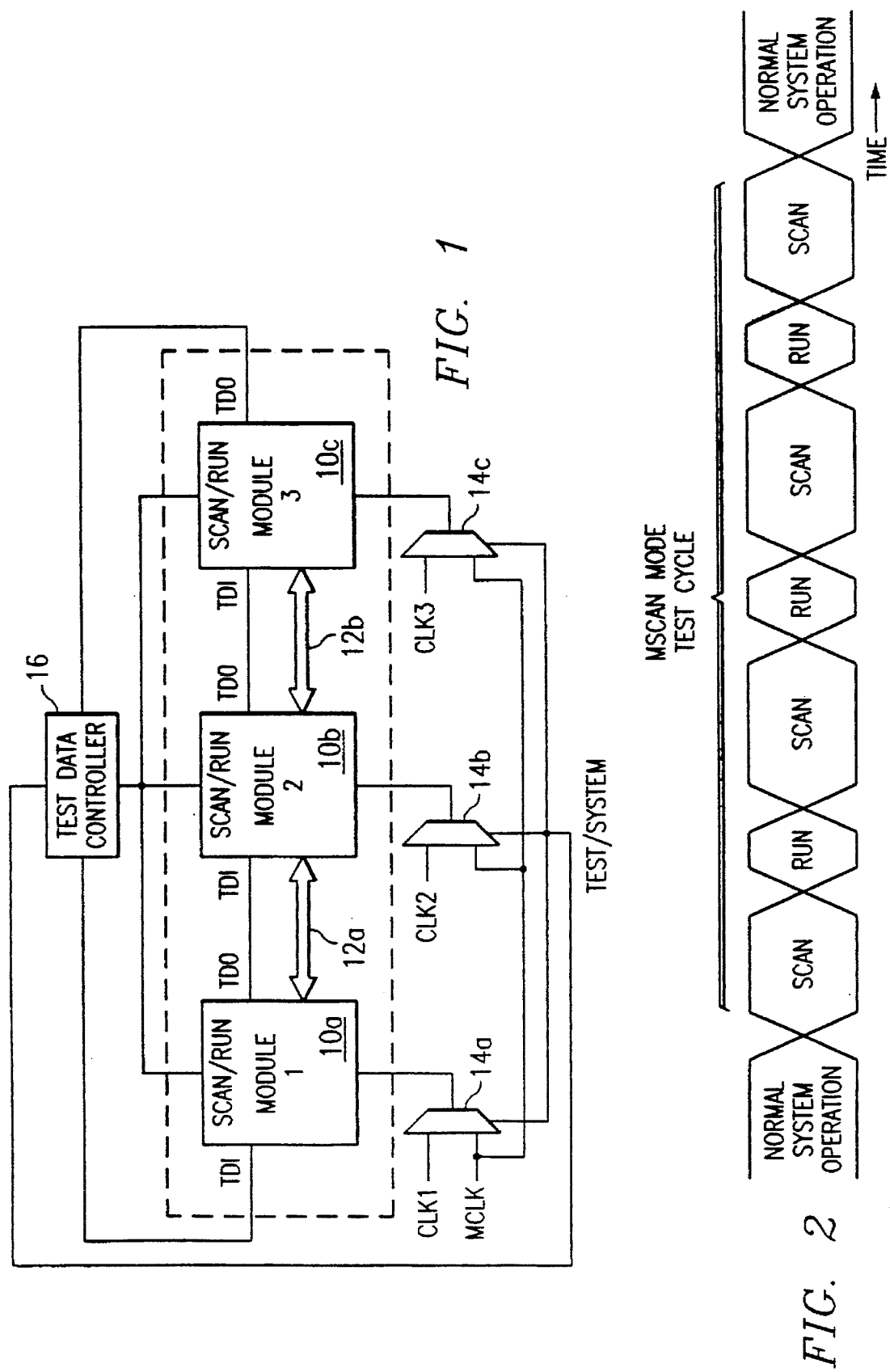
FIG. 1 illustrates a block diagram of the present invention.
FIG. 2 illustrates a timing diagram illustrating a test cycle.

The preferred embodiment of the present invention is best understood by referring to FIGS. 1–2 of the drawings, like numerals being used for like and corresponding parts of the various drawings.

FIG. 1 illustrates a block diagram of the present invention. A circuit 8 comprises three circuit modules 10a–c, are illustrated, with each module controlled by a corresponding clock (CLK1, CLK2, and CLK3) during normal operation of the circuit 8. The modules communicate with each other over connections 12a–b. It should be noted that this arrangement of circuitry modules is arbitrary, and more complex circuit architectures are possible.

The modules 10a–c are clocked by the output of respective multiplexers 14a–c. CLK1, CLK2 and CLK3 are input to the first inputs of the respective multiplexers 14a–c. A master clock (MCLK) is connected to the second input of each multiplexer 14a–c. A TEST/SYSTEM signal is connected to the select ports of the multiplexers 14a–c. A test data controller 16 is connected to the scan path through the modules 10a–c. Typically, the scan path is a serial scan path in which data is shifted through each module. Hence, the test data controller 16 outputs data which is received by module 10a through its TDI (test data input). Data stored in various test registers in the module 10a is shifted out via the TDO (test data output) in response to the data output from the test data controller 16. Data from the TDO of module 10a is shifted into the TDI of module 10b. Data shifted out of the TDO of module 10b is shifted into the TDI of module 10c. Consequently, data shifted out of the TDO of module 10c is output to the test data controller 16. Hence, the scan path through the various modules 10a–c can be thought of as a shift register.

The test data controller 16 also outputs a SCAN/RUN signal to the modules 10a–c. The SCAN/RUN signal indicates to the module whether a test scan operation is being performed, wherein test data is being shifted through the scan path, or a test run operation is performed, wherein the circuit modules 10a–c perform their normal operations on the previously loaded test data in response to clock cycles output from the multiplexers 14a–c.

Typically, the testing sequence comprises loading test data into the modules, followed by a single test run cycle (i.e., a single clock cycle output from the multiplexers 14a–c). The test data is then scanned from the modules 10a–c where the test data controller may analyze the effect that the operation had on the test data. Subsequently, additional test data is loaded into the modules 10a–c and another scan operation and another run cycle is performed. This sequence of scanning test data in, performing operation, analyzing the test data, scanning in additional test data, performing another run cycle, and so on, is very effective in detecting errors in the circuit design and physical defects in the circuit. The test cycle is illustrated in FIG. 2, preceded and followed by normal system operation.

In the preferred embodiment of the present invention, the respective system clocks, CLK1, CLK2 and CLK3, are used during normal system operation of the circuit 8. When a test is to be performed, the TEST/SYSTEM signal is set such that the MCLK signal is passed through the multiplexers 14a–c to the modules 10a–c. Hence, at this point, all of the modules are operating at the same frequency. The SCAN/RUN signal is set such that the modules shift data through the scan path in response to a scan signal, and operate on the test data in response to a run signal. The effect of the SCAN/RUN and TEST/SYSTEM signals is illustrated in Table 1.

TABLE 1

| TEST/SYSTEM | SCAN/RUN | STATUS |
| --- | --- | --- |
| 0 | X | Normal system operation |
| 1 | 0 | Scan Data |
| 1 | 1 | Run Cycle |

X = don't care

During the test cycle, the entire circuit 8 is under the control of the MCLK signal, which controls both the scan cycles and the run cycles. This eliminates the problems of partitioning modules and synchronizing different clocks during the signal run cycle between scan cycles.

The MCLK frequency can be the same frequency as one of the system clocks, typically the slowest clock frequency, or could be of a frequency different than any of the system clocks. The MCLK could also output different frequencies, for example, one frequency for scanning and one or more frequencies for test run cycles, so long as the MCLK is simultaneously connected to all modules under test.

It should be noted that while the clocks are illustrated as multiplexed to the modules through the multiplexers 14a–c, this is not absolutely necessary; the master clock could be connected in parallel with the system clocks and a control circuit could enable operation of either the system clocks or the master clock at any one time.

Although the present invention has been described in detail, it should be understood that various changes, substitutions and alterations can be made herein without departing from the spirit and scope of the invention as defined by the appended claims.

What is claimed is:

1. A method of testing a circuit comprising a plurality of modules controlled by two or more system clocks, each of differing frequencies, comprising the steps off disabling said two or more system clocks of differing frequencies from the modules;

enabling a master clock to control said modules;

scanning test data through the modules using the master clock;

performing a run cycle on the modules using said master clock;

scanning additional test data through the modules using the master clock; and disabling said master clock and enabling each of said two or more system clocks to again control a corresponding module.

2. The method of claim 1 wherein said disabling step comprises the step of using one of said system clock frequencies as the master Clock frequency.

3. The method of claim 2 wherein the master clock frequency comprises the frequency of the slowest of the system clocks.

4. The method of claim 1 wherein said master clock is operable to output a single frequency.

5. The method of claim 1 wherein said step of scanning data though the modules comprises the steps of generating a signal to the modules indicating that a scan operation is to be performed and outputting test data to the modules.

6. The method of claim 1 wherein said step of performing a run cycle comprises the step of generating a signal to the modules indicating that a run cycle is to be performed.

7. The method of claim 1 wherein said step of performing a run cycle comprises the step of operating the modules over a single clock cycle.

8. The method of claim 1 and further comprising the step of generating a test signal indicating that a test cycle is desired.

9. The method of claim 1 and further comprising the step of enabling the system clocks to the respective modules after the test cycle is completed.

10. A method of testing a circuit comprising a plurality of modules controlled by two or more system clocks, each of differing frequencies, comprising the steps of:

performing run cycles using the system clocks;

disabling said two or more system clocks of differing frequencies from the modules;

enabling a master clock to control said modules;

scanning test data through the modules using the master clock;

performing a run cycle on the modules using the master clock;

scanning additional test data through the modules using the master clock;

disabling said master clock;

enabling the system clocks of differing frequencies to control said modules; and performing additional run cycles using the system clocks of differing frequencies.

11. Circuitry for testing a plurality of modules controlled by two or more system clocks of differing frequencies, comprising:

a master clock;

a control circuit means for switching the control of said modules between said system clocks of differing frequencies and said master clock;

a test data controller circuitry means for scanning test data through the modules using the master clock, and also for performing a run cycle on the modules.

12. The circuitry of claim 11 wherein said control circuitry means comprises means for using one of said system clock frequencies as the master clock frequency.

13. The circuitry of claim 12 wherein the master clock frequency comprises the frequency of the slowest of the system clocks.

14. The circuitry of claim 11 wherein said master clock is operable to output a single frequency.

15. The circuitry of claim 11 wherein said test data controller circuitry means for scanning data through the modules comprises means for generating a signal to the modules indicating that a scan operation is to be performed and means for outputting test data to the modules.

16. The circuitry of claim 11 wherein said test data controller circuitry means for performing a run cycle comprises means for generating a signal to the modules indicating that a run cycle is to be performed.

17. The circuitry of claim 11 wherein said test data controller circuitry means for performing a run cycle comprises means for generating a signal to the modules indicating that a run cycle is to be performed.

18. The circuitry of claim 11 and further comprising means for generating a test signal indicating that a test cycle is desired.

19. Circuitry for testing a plurality of modules controlled by two or more system clocks of differing frequencies, comprising:

a master clock;

a test data controller means for performing run cycles using the system clocks;

a control circuit means for switching the control of said modules between said system clocks of differing frequencies and said master clock;

said test data controller means further for scanning test data through the modules using the master clock;

said test data controller means further for performing a run cycle on the modules using the master clock;

said test data controller means further for scanning additional test data through the modules using the master clock; and said test data controller means for performing additional run cycles using the system clocks of differing frequencies.

* * * * *